(12) United States Patent
Chou et al.

(10) Patent No.: US 8,345,476 B2
(45) Date of Patent: Jan. 1, 2013

(54) MULTI-LEVEL CELL PROGRAMMING SPEED IMPROVEMENT THROUGH PROGRAM LEVEL EXCHANGE

(75) Inventors: Tsung Yi Chou, Jhubei (TW); Ti Wen Chen, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 407 days.

(21) Appl. No.: 12/797,928

(22) Filed: Jun. 10, 2010

(65) Prior Publication Data
US 2011/0222341 A1 Sep. 15, 2011

(30) Foreign Application Priority Data

Mar. 10, 2010 (TW) .............................. 99107013 A

(51) Int. Cl.
*G11C 16/04* (2006.01)
(52) U.S. Cl. ......... 365/185.03; 365/185.18; 365/185.19; 365/185.24; 365/185.16

(58) Field of Classification Search ............. 365/185.03, 365/185.18, 185.19, 185.24, 189.16
See application file for complete search history.

(56) References Cited

U.S. PATENT DOCUMENTS

| | | | |
|---|---|---|---|
| 5,907,855 A * | 5/1999 | Norman | 711/103 |
| 6,160,739 A * | 12/2000 | Wong | 365/185.29 |
| 6,728,825 B1* | 4/2004 | Norman | 711/103 |
| 7,430,693 B2* | 9/2008 | Noguchi et al. | 714/710 |
| 7,656,705 B2* | 2/2010 | Hamilton et al. | 365/185.03 |
| 2009/0103357 A1* | 4/2009 | Hamilton et al. | 365/185.03 |
| 2010/0011158 A1* | 1/2010 | Shiraishi et al. | 711/103 |
| 2010/0315873 A1* | 12/2010 | Lee | 365/185.03 |
| 2010/0329033 A1* | 12/2010 | Kamigaichi | 365/185.24 |
| 2011/0246703 A1* | 10/2011 | Franceschini et al. | 711/103 |
| 2011/0305082 A1* | 12/2011 | Haratsch et al. | 365/185.03 |

* cited by examiner

*Primary Examiner* — Viet Q Nguyen
(74) *Attorney, Agent, or Firm* — Stout, Uxa, Buyan & Mullins, LLP

(57) ABSTRACT

A method of storing data in a multi-level charge-trapping memory array is described. An incidence-of-occurrence (i.e., frequency) analysis is performed on data to be programmed to identify data words combining a high programming voltage with a high frequency of occurrence. Those words are reassigned in order to reduce programming time.

20 Claims, 6 Drawing Sheets

MULTI-LEVEL CELL PROGRAMMING SPEED IMPROVEMENT THROUGH PROGRAM LEVEL EXCHANGE

CROSS-REFERENCE TO RELATED APPLICATIONS

The entire contents of Taiwan Patent Application No. 099107013, filed on Mar. 10, 2010, from which this application claims priority, are incorporated herein by reference.

BACKGROUND OF THE INVENTION

1. Field of the Invention

An embodiment of the present invention relates generally to semiconductor memories and, more particularly, to methods of programming semiconductor memories.

2. Description of Related Art

Charge-trapping memories, commonly referred to as flash memories, find extensive use in a wide range of electronic devices including cameras, cellular telephones and personal digital assistants as well as modems, laptop computers and the like. Charge-trapping memories are capable of storing relatively large amounts of data in relatively small spaces. Data stored in charge-trapping memories maintains its integrity even in the absence of applied power.

A cell of a charge-trapping memory can be programmed by modifying a threshold voltage associated with the cell. Reading data from the cell can be accomplished by applying a reference voltage and detecting a current level. A single-level cell (SLC) is programmable to one of two distinguishable threshold levels for storage of one bit of information. When, for example, four or eight distinguishable threshold levels can be supported by the cell, the cell can be capable of storing, respectively, two or three bits of data. A cell that can store more than one bit of data has been referred to as a multi-level cell (MLC).

The time required to program (i.e., write to) a charge-trapping memory can be relatively large compared to that required to read from the memory. In applications involving electronic devices where data is to be stored as rapidly as possible (e.g., in a digital camera), lengthy programming times can act to hamper efficiency of operation of the memory to the detriment of overall device performance.

A need thus exists in the prior art to reduce the programming time in charge-trapping memories.

SUMMARY OF THE INVENTION

An embodiment of the present invention addresses this need by providing a method of programming a multi-level charge-trapping memory cell array. According to a native (e.g. predefined) operation of the array, each different word is matched to a different programming voltage level for programming in the array with words having the same value being programmed in the array at the same programming level. According to the method of an embodiment of the invention, a block of words to be programmed is received, occurrences of each different word in the block are counted to determine a frequency number for each different word, and the matching (according to the native operation of the array) is revised, thereby changing a programming voltage level of at least one of the words.

Other things being equal, greater programming voltage levels conventionally require commensurately greater programming times. A feature of an embodiment of the invention is to revise the matching in such a way as not to increase a time to program the block. According to one implementation of the method, the revising can actually reduce the time required to program the block.

A particular implementation of the method performs the revising by creating a first list comprising the programming voltage levels arranged in order of increasing voltage and creating a second list comprising the words in the block arranged in order of decreasing frequency number. Here, words in the second list are in one-to-one correspondence with programming voltage levels in the first list. Each word in the second list is then associated with the corresponding programming voltage level in the first list, the correspondence defining an exchange rule.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of an embodiment of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing an embodiment of the present invention, certain aspects, advantages and novel features of an embodiment of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Figure 1:
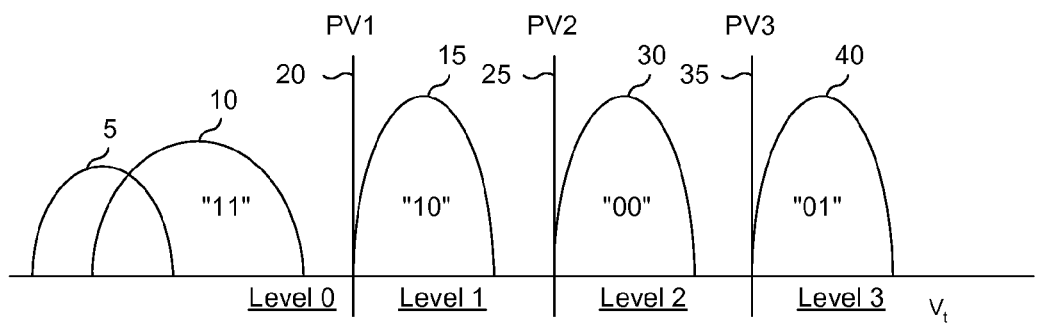
FIG. 1 is a chart illustrating distributions of programming voltage levels for a four-level charge-trapping memory cell (CTMC)

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. An embodiment of the present invention may be practiced in conjunction with various integrated circuit techniques that are conventionally used in the art, and only so much of the commonly practiced process steps are included herein as are necessary to provide an understanding of the present invention. An embodiment of the present invention has applicability in the field of semiconductor devices and processes in general. For illustrative purposes, however, the following description pertains to a memory device and a related method.

In an array of charge-trapping memory cells (CTMCs), a memory cell may be programmed by applying programming voltages to and changing a threshold voltage ($V_t$) of the cell. More particularly, the programming voltages generate electrons having sufficient kinetic energy to reach and become trapped at a transistor gate of the cell where they may influence a threshold voltage ($V_t$) of the cell. A single-level CTMC may be programmed to either of two programming (i.e., programming voltage) levels, whereas a multi-level CTMC may be programmable to any of, for example, four, eight, or sixteen levels.

FIG. 1 illustrates the programming levels of a four-level CTMC. According to the illustrated example, a level 0 $V_t$ corresponds to an unprogrammed or erased state, corresponding to the multi-level CTMC being interpreted to contain "all ones" data. In the figure, level 0 $V_t$ values, which may correspond to a pair of binary data values (i.e., a word) 11, may appear as one of the distributions 5 or 10. Level 1 $V_t$ values 15, which may correspond to a word 10, may have $V_t$ values greater than a first program verify level PV1 20 but less than a second program verify level PV2 25. Similarly, level 2 $V_t$ values 30, which may correspond, for example, to a word 00, may be distributed over a range greater than the second program verify level PV2 25 but less than a third program verify level PV3 35. Level 3 $V_t$ values 40 may be distributed over a range greater than PV3 35 and may correspond to a word 01. Generally, each individual 2-bit word corresponds to (i.e., is matched to, specifies, or delineates) one of four programming levels. Similarly, 3-bit words correspond to one of eight programming levels and so on for words containing a larger number of bits.

The association of words with programming levels illustrated in FIG. 1 for a 4-level CTMC may be referred to as a "code scheme" (e.g., of a chip) that operates to specify how input data bits (e.g., words) are to be transformed (e.g., stored or programmed) into physical memory (e.g., as programming levels). For instance, according to a particular example, word 11 can correspond to a programming level 0, word 10 can correspond to a programming level 1, and so on. Each different word thus is directly (and uniquely) associated (i.e., matched) with a different programming level, meaning, incidentally, that words of the same value (e.g., all 01 words) are programmed in the array at the same programming voltage level. The particular code scheme illustrated in FIG. 1, which can be considered as an example of a "native" (e.g., predefined or chip-specific) code scheme defining correspondences between words and their predefined matched programming levels, is outlined in Table 1 as follows:

TABLE 1

| (Native-code scheme) | | | | |
|---|---|---|---|---|
| word | 11 | 10 | 00 | 01 |
| Prog. level | Level 0 | Level 1 | Level 2 | Level 3 |

The code scheme is referred to as "native" because it is directly associated with the CTMC array, for example, without regard to considerations peripheral to the array. When the programming levels are arranged in increasing order, the code scheme may be defined by listing its constituent words according to (following) the same order. For example, the native-code scheme of Table 1 may be listed as {11, 10, 00, 01}. In this disclosure, an arbitrary native-code scheme may be written as {n0, n1, n2, n3} as shown in Table 2.

TABLE 2

| word | n0 | n1 | n2 | n3 |
|---|---|---|---|---|
| Prog. level | Level 0 | Level 1 | Level 2 | Level 3 |

In the examples presented in this disclosure, {n0, n1, n2, n3}={11, 10, 00, 01} unless otherwise noted. (As used herein, the order of items, such as words, listed inside braces { } is important unless stated otherwise. That is, if {a, b, c, d}={e, f, g, h}, then it is to be understood that a=e, b=f, c=g, and d=h}.)

Of course, many 4-level native-code schemes may be constructed. That is, one of four available words may be chosen as n0; then, with n0 chosen, one of the remaining three words may be chosen as n1; and so on. It may be observed that there exist 4·3·2·1=4!=24 possible 4-level native-code schemes. For example, other possible native-code schemes include {n0, n1, n2, n3}={00, 01, 10, 11} and {n0, n1, n2, n3}={11, 00, 10, 01}. The present invention may advantageously be applied to multi-level CTMC memory devices employing any such native-code schemes. Further, it will be apparent to one skilled in the art that the methods and apparatus described herein may be modified to apply to multi-level CTMC arrays using, for example, eight, sixteen, and more levels.

The words in the first row of Table 2 may be visualized as instructions to a virtual "micro-programmer" disposed inside the CTMC array to modify the $V_t$ of a cell located at a given address according to (e.g., following the native-code scheme for programming of) the word. That is, when the micro-programmer receives n0 it will do nothing; when it receives n1 it will modify the $V_t$ of the cell at the given address to level 1, and so on. Conversely, when reading from a multi-level CTMC array, a cell having a level 0 $V_t$ is read as n0, a cell having a level 1 $V_t$ is read as n1, and so on.

Programming a multi-level CTMC to a given programming level, say, PV1 may include a step of applying at least one pulse of a programming voltage (i.e., a "shot") to the cell, the shot being chosen to increase the threshold voltage $V_t$ of the cell by an amount of a program voltage, for example, 5 mV. A sensing step may then be performed to determine whether the threshold voltage of the transistor is greater than or equal to PV1. The process may be repeated, applying additional shots as required, until the greater than or equal condition is satisfied. Driver circuitry may be used to provide a capability to apply programming voltages, and a sense amplifier (SA) may be employed to perform the sensing step. According to an exemplary embodiment, each SA has a corresponding driver associated therewith. Each cell in an array, therefore, may be programmed to a desired programming level by an SA and corresponding driver.

Practical restrictions, such as program current limitations and noise immunity, can limit the number of drivers and SAs allowed to be active at the same time in a multi-level CTMC configuration. For example, it may be practical to operate no more than 64 SAs and corresponding drivers simultaneously. In another embodiment, it may be practical to employ simultaneously 128 SAs and corresponding drivers.

Figure 2:
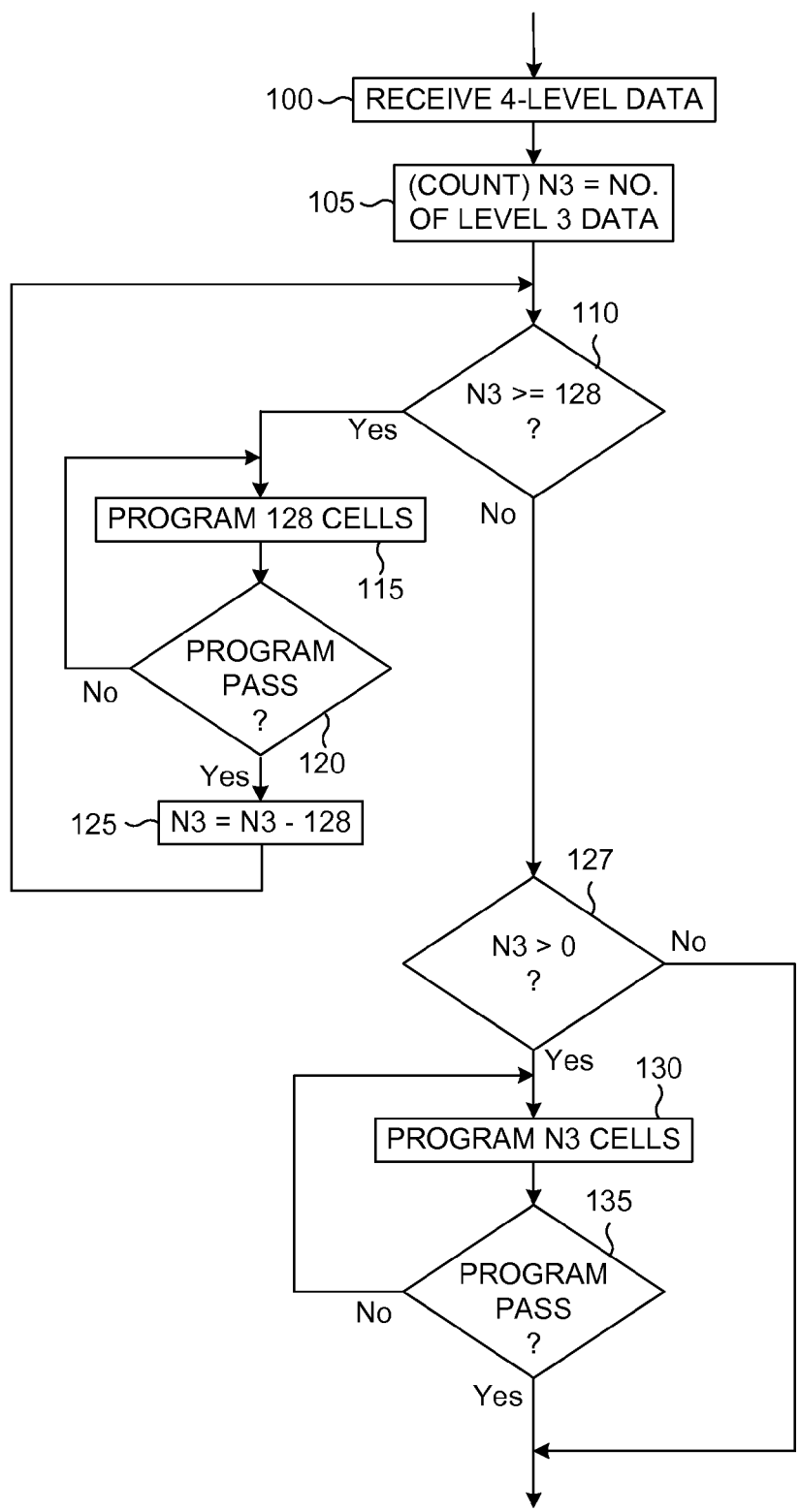
FIG. 2 is a flow diagram summarizing a known method of programming a four-level CTMC with level 3 data.

FIG. 2 is a flow diagram illustrating an implementation of a known method of programming a multi-level CTMC with, for example, level 3 words. A group of, for example, 256, 512, or 1024 quaternary (i.e., four-level) words {11, 10, 00, 01} (e.g., 1001110101 . . . ), which the CTMC may interpret according to Table 1, is received at step 100. In the illustrated implementation, the method selects level 3 values from the received group for programming. At step 105 a count is performed to determine a number, N3, of level 3 words (i.e., 10) in the received group. According to a typical embodiment, 128 SAs are available to be used at any one time. At step 110 a test is performed to determine whether the number of level 3 words is at least 128. If so, then 128 cells slated to be programmed to level 3 are selected and programmed at step 115 by applying a shot to each of the 128 selected level 3 cells. At step 120 a test is performed to determine whether all 128 selected level 3 cells have, indeed, achieved a $V_t$ at least as great as, for example, PV3. If not, then the cells may receive another shot at step 115, the 115/120 steps being repeated until the $V_t$ of all cells in the group is at least PV3. The value of N3 may then be decremented by 128 (step 125), and the process repeated from step 110. When the value of N3 becomes less than 128, then a test is performed at step 127 to determine whether N3 is greater than zero. If so, then steps 130 and 135 are performed (cf. steps 120 and 115 above) until all N3 cells have been programmed to the prescribed level. The implementation is completed when no more level 3 cells remain to be programmed as is determined at either step 110 or step 135. Methods for programming cells to level 1 and level 2 will be evident to one skilled in the art in view of the above.

An amount of time, $T_k$, required to complete programming of a memory device to level k for k=1, 2, and 3 using, for example, 128 SA/drivers, is, at least approximately, a product of 1) an amount of time, $T_S$, required to perform each shot and verify the result, 2) a number of shots, $N_k$, required to complete programming of a cell to level k, and 3) $[N_{Ck}/128]$ where $N_{Ck}$ is the number of cells to be programmed to level k, and an operation [•] rounds up "•" to the next-highest integer when "•" is not an integer. For example if $N_{Ck}$=129, then $[N_{Ck}/128]$=2, and if $0<N_{Ck}<=128$, then $[N_{Ck}/128]$=1. Formulas for $T_1$, $T_2$, and $T_3$ are:

$$T_1 = T_S * N_1 * [N_{C1}/128]$$

$$T_2 = T_S * N_2 * [N_{C2}/128]$$

$$T_3 = T_S * N_3 * [N_{C3}/128]$$

As it is common to $T_1$, $T_2$ and $T_3$, $T_S$ may be ignored when comparing values of $T_1$, $T_2$ and $T_3$. Considering $N_1$, $N_2$, and $N_3$, Table 3 lists experimentally determined maximum, minimum, and midrange values of $N_k$, for k=1, 2, and 3. Programming a cell to, for example, program level 3 may comprise applying a first shot having a relatively low level of PV3' (i.e., phase 1) followed by a second shot having a relatively higher level of PV3 (i.e., phase 2) where PV3'<PV3. Consideration of window or programming time may influence selection of phase 1 and phase 2 programming levels. Additional phases (e.g., phase 3, phase 4, . . . ) may be employed in some situations. Using the midrange values for $N_k$, and ignoring $T_S$,

TABLE 3

| Level k | Phase 1 Min | Phase 2 Min | Min Total | Phase 1 Max | Phase 2 Max | Max Total | Midrange $N_k$ |
|---|---|---|---|---|---|---|---|
| Level 3 | 80 | 64 | 144 | 96 | 80 | 176 | 160 |
| Level 2 | 64 | 64 | 128 | 80 | 80 | 160 | 144 |
| Level 1 | 48 | 48 | 96 | 64 | 64 | 128 | 112 |

$$T_3 \sim 160 [N_{C3}/128]$$

$$T_2 \sim 144 [N_{C2}/128]$$

$$T_1 \sim 112 [N_{C1}/128]$$

where the tilde grapheme denotes "is proportional to."

As a basic example, consider receiving a block of 256 quaternary (e.g., two-bit) words, with 50 to be programmed at level 0, 36 to be programmed at level 1, 40 to be programmed at level 2, and 130 to be programmed at level 3. In this case, $$T_3 \sim 160 \times 2 = 320$$

$$T_2 \sim 144 \times 1 = 144$$

$$T_1 \sim 112 \times 1 = 112, \text{ and}$$

the total programming time required is $T_1+T_2+T_3 \sim 320+144+112=576$.

In the basic example, had the block contained 130 level 0 rather than 130 level 3 words, programming time and/or resources could potentially be reduced or conserved. A feature of an embodiment of the present invention seeks to achieve such a reduction and/or conservation by way of, for example, reassigning programming levels at which words are to be stored. For instance, a reassignment (e.g., a revised matching) may comprise assigning words to program voltage levels in a way that can improve programming efficiency. In the given example, all 130 of the 01 words may be stored at level 0 rather than at level 3. Of course, typically, this reassignment will require that one or more of the other words be reassigned as well in order that the association between words and program levels maintains its uniqueness property, as will now be described.

Figure 3:
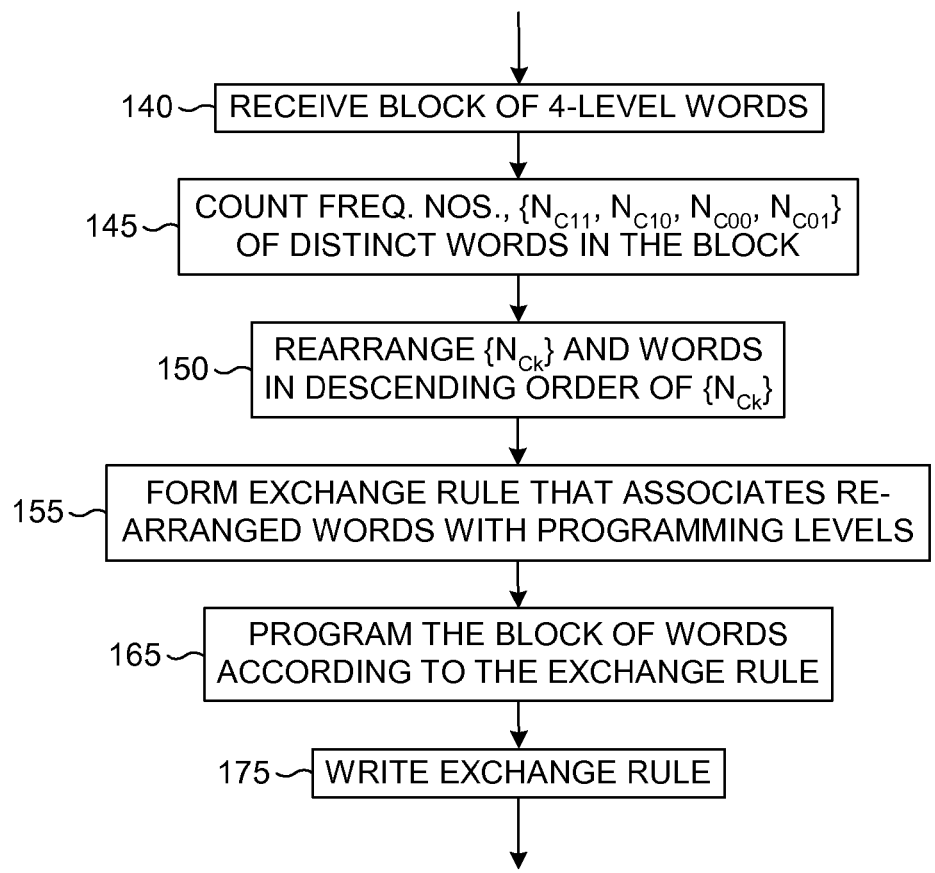
FIG. 3 is a flow diagram illustrating an implementation of a first method of programming a four-level CTMC according to the present invention.

FIG. 3 is a flow diagram summarizing an implementation of a first method of an embodiment of the present invention. A block of quaternary words is received at step 140 for programming into a four-level CTMC array. The block may contain, for example, 256, 512, 1024 or words representing, for example, a portion of a digital image, an address book, or, for example, another set of user or machine data. At step 145, four frequency numbers are determined by counting a number of occurrences in the block of different words 11 ($N_{C11}$), 10 ($N_{C10}$), 00 ($N_{C00}$), and 01 ($N_{C01}$). Relative to the basic example, Table 4 lists the words of Table 1, programming levels, and frequency numbers related to each word, as follows:

TABLE 4

| (Words ordered by native-code scheme) | | | | |
|---|---|---|---|---|
| Prog. Level | 0 | 1 | 2 | 3 |
| word (native-code scheme) | 11 | 10 | 00 | 01 |
| Frequency No. | 50 | 36 | 40 | 130 |

Here, in the general context of each inputted datum/item of information (e.g., each word) and how it is stored in memory, it may be wasteful to store the word having the most instances (130) using the highest programming level. Thus, according to an aspect of an embodiment of the present invention, wasteful paradigms are corrected by way of a reassignment of words to programming levels so that, for example, a word occurring in high numbers (e.g., with high frequency) and/or a word inefficiently assigned/coded to a high programming level, is reassigned to a lower programming level for programming in the array. Subsequently, when the block, or a portion of the block of words, is read from the CTMC array, a reverse assignment can restore the words to their original form.

Step 150 elucidates, in the context of the current example, the above approach for discerning the inefficiencies just described, by rearranging words according to the frequency numbers $\{N_{C11}, N_{C10}, N_{C00}, N_{C01}\}$ to which they correspond, in descending order of the frequency number. After the rearrangement, one, two, or more of the words are associated with new programming levels. In general, the programming levels are arranged (according to a first list) in order of increasing voltage, and words are arranged (according to a second list) in order of decreasing frequency number to yield a collection of information as exemplified, relative to the basic example, in Table 5, where the native-code scheme is listed for reference.

TABLE 5

| (Reordered words) | | | | |
|---|---|---|---|---|
| Prog. Level | 0 | 1 | 2 | 3 |
| native-code scheme | n0 | n1 | n2 | n3 |
| word | 01 | 11 | 00 | 10 |
| Frequency No. | 130 | 50 | 40 | 36 |

According to step 155 an exchange rule is constructed by defining a reassignment of words in the block in order to reduce or conserve resources, such as programming time. In the basic example, comparing Table 4 with Table 5, the exchange rule may be visualized as tabulated in the "word" row in Table 6 as follows.

TABLE 6

| (Exchange Rule) | | | | |
|---|---|---|---|---|
| Prog. Level | 0 | 1 | 2 | 3 |
| native-code scheme | n0 | n1 | n2 | n3 |
| word | 01 | 11 | 00 | 10 |

The exchange rule is used in step 165, to program the block of words into the array. For instance, relative to the basic example, 01 is programmed at level 0, 11 is programmed at level 1, 00 is programmed at level 2 (unchanged), and 10 is programmed at level 3.

Here, writing 01 to memory 130 times at programming level 3, under the native-code scheme, would have been inefficient (especially since the other codes each occur less than 51 times). The higher/highest-frequency word (e.g., 01) is mapped to a lower/lowest programming level (e.g., Prog. Level 0) thus conserving resources. Also, according to another aspect, as in the example, the lowest/lower frequency word (e.g., 10) is mapped to a higher/highest programming level (e.g., Prog. Level 3) thus conserving resources. It should be clear that the revising of matching of words to program levels according to the first method of an embodiment of the present invention does not increase a number of shots (and therefore programming time) required to program a block of words.

The exchange rule could, as well, be defined by listing its words $\{01, 11\ 00, 10\}$ in the basic example, which, according to the implementation of the first method, prescribes a rule to be used in programming the block of input data (e.g. words). In general, the exchange rule may simply comprise a listing of the reassigned words arranged in order of increasing programming voltage level. That is, the exchange rule defines how instances of words identified in the block of input data are to be programmed into the memory array at step 165. The exchange rule may be written into the CTMC at step 175 as control information (i.e., words not subjected to the exchange rule). One format that may be used to write the exchange rule lists the words in order as illustrated in Table 6. In the example above, the exchange rule may be written as a sequence 01110010 of eight bits (equivalently, four words). The eight-bit sequence may be referred to as "record bits," or a "record code." It may be noted that an eight-bit record code may define the exchange rule according to the first method.

Figure 4:
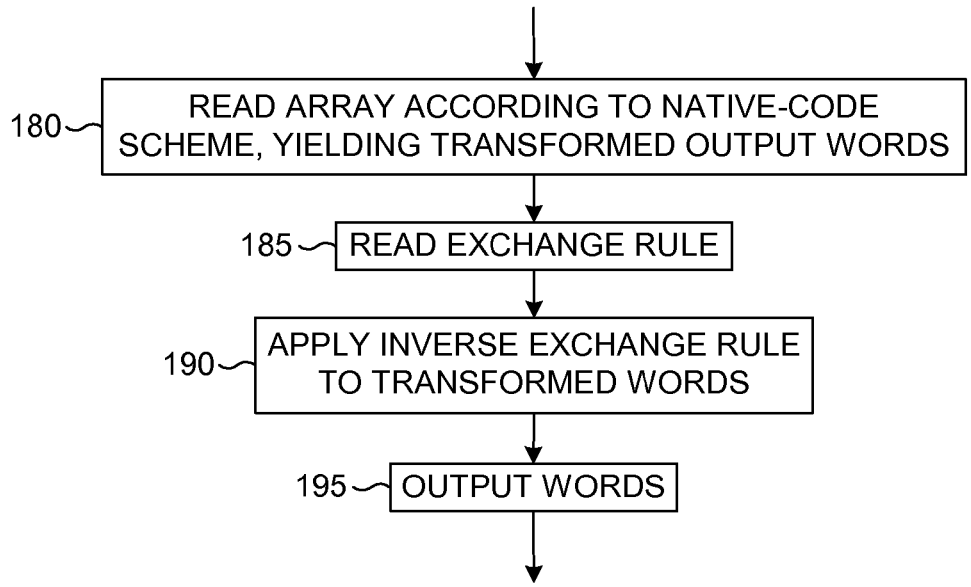
FIG. 4 is a flow diagram describing an implementation of a method of reading a four-level CTMC that has been programmed according to the first method.

To read from a CTMC array programmed according to the first method of an embodiment of the present invention, a method, an implementation of which is summarized in a flow diagram in FIG. 4, may be employed. The words may be read normally (i.e., according to the native-code scheme) from the array at step 180 to yield a block or a portion of a block of transformed words, i.e., words programmed according to the exchange rule but read according to the native-code scheme. The exchange rule may be read at step 185, and an inverse (e.g., reverse or untransformed version) of the exchange rule may be applied to the block of transformed words at step 190. That is, occurrences in the block of transformed words represented by the native-code scheme may be replaced with corresponding words according to the exchange rule. For instance, $\{n0, n1, n2, n3\}$ is replaced with $\{01, 11, 00, 10\}$ in the basic example (cf. Table 6). Subsequently, the "untransformed" block of words may be output at step 195.

According to another aspect of an embodiment of the present invention, a second method may employ an exchange rule modified relative to that of implementations of the first method. According to the second method, the exchange rule simply defines a word reassignment that programs the highest-frequency word to level 0. The reassignment vacates a program level (according to the native-code scheme) previously corresponding to the highest-frequency word and also vacates a word previously corresponding to program level 0. The reassignment is completed by associating the vacated word with the vacated program level. (If the highest-frequency word is already assigned to level 0, then no reassignment is performed.) That is, the second method of an embodiment of the present invention reassigns words previously requiring the largest number of shots for programming to level 0, which requires no shots at all.

Figure 5:
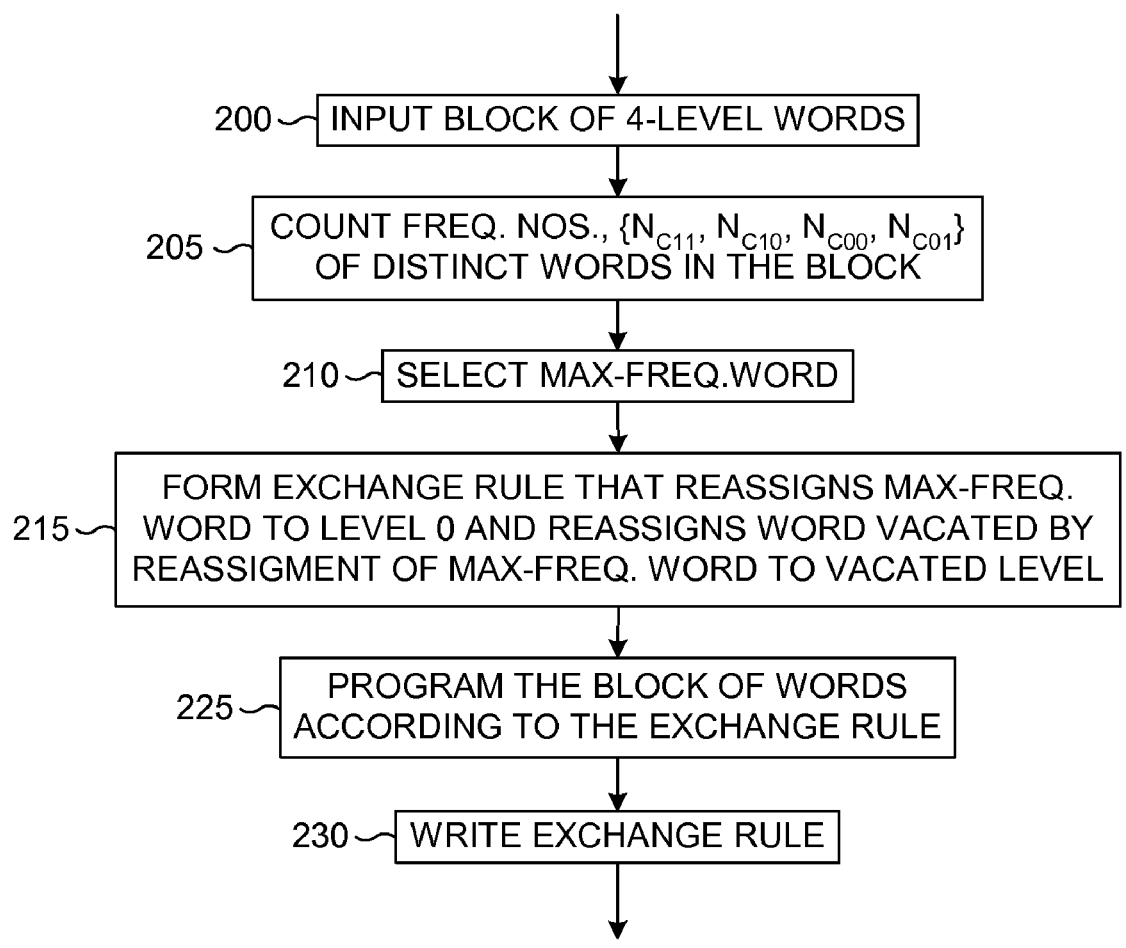
FIG. 5 is a flow diagram depicting an implementation of a second method of programming a four-level CTMC according to the present invention.

FIG. 5 is a flow diagram that summarizes an implementation of the second method. At step 200, a block of four-level words is received, and numbers of occurrences $\{N_{C11}, N_{C10}, N_{C00}, N_{C01}\}$ of each of four distinct words $\{11, 10, 00, 01\}$ are counted at step 205. At step 210, a maximum-frequency word is chosen according to the $\{N_{C11}, N_{C10}, N_{C00}, N_{C01}\}$.

An exchange rule is formed at step 215 that reassigns a high-frequency (e.g. maximum-frequency) word to a lower or lowest level (e.g. level 0), thereby vacating a programming level previously assigned to the word and that leaves a word that was previously assigned to level 0. The exchange rule is completed by simply reassigning the latter word to the latter programming level. The words are programmed at step 225 according to the exchange rule, and the exchange rule is written, for example, as a record code, at step 230. One example of a record code corresponding to the exchange rule, according to the second method, may constitute a two-bit sequence of record bits or, equivalently, a two-bit record code, which identifies the maximum-frequency word. In the basic example above, the record code resulting from application of the implementation of FIG. 5 may be 01, to indicate that instances of 01 in the block are to be programmed to level 0. By default, it is understood that the word previously assigned to level 0 is to be programmed to the level vacated by the maximum-frequency word.

Reading data that has been programmed may be accomplished by applying the method summarized in FIG. 4 with the exchange rule read at step 185 being interpreted under the second method.

Figure 6:
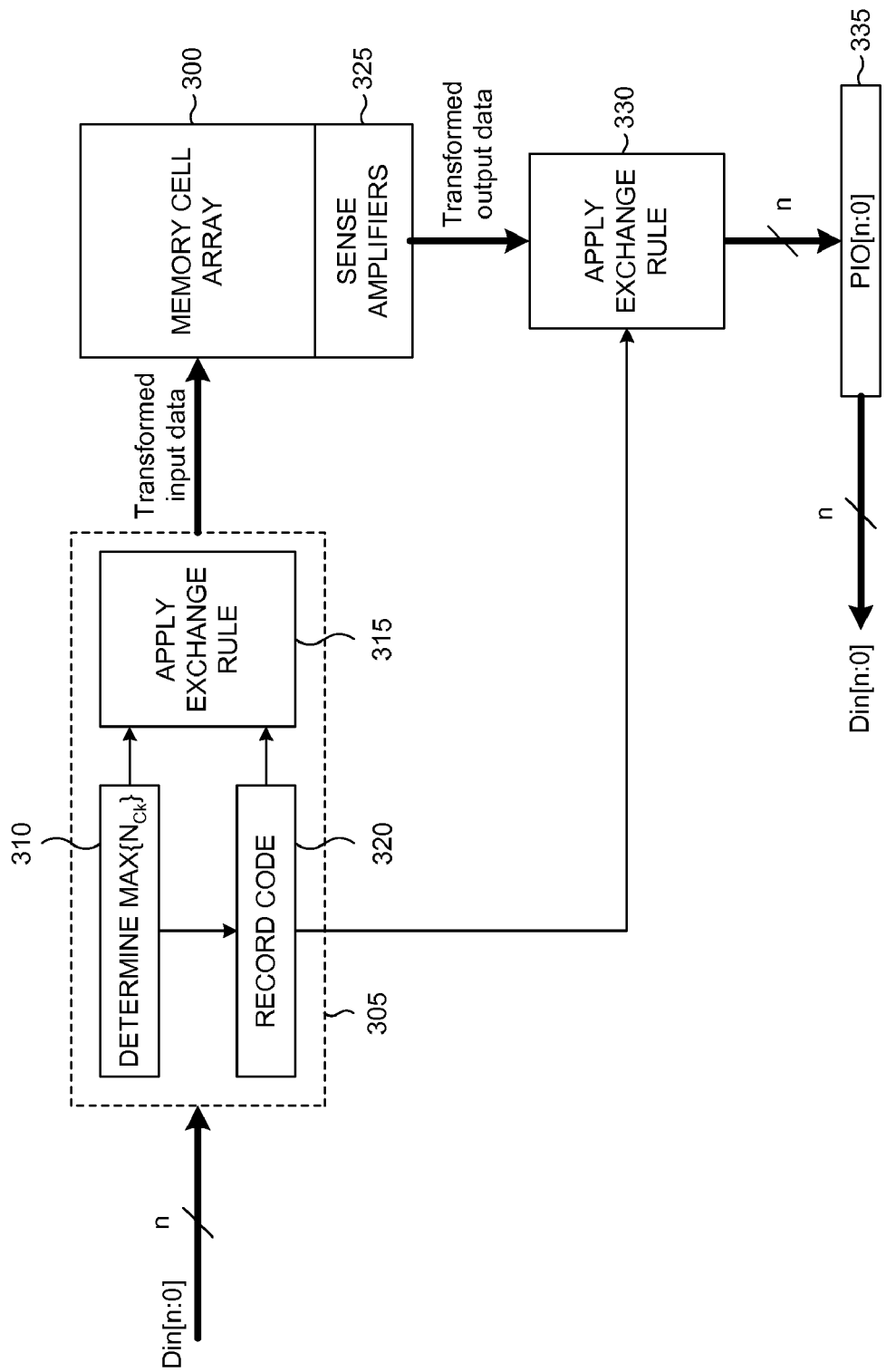
FIG. 6 is a block diagram of an apparatus configured to program and read from a multi-level CTMC according to the present invention.

FIG. 6 is a block diagram of an embodiment of an apparatus that may implement the second method of the present invention. The embodiment comprises a CTMC array 300 configured to be programmed with multi-level (e.g., four-level) words according to a predetermined definition (e.g., a native-code scheme {n0, n1, n2, n3}). The illustrated embodiment further comprises an input processor 305 that receives a block of words to be programmed, denoted as Din[n:0] in the diagram, and processes the words according to the second method before they are programmed into the CTMC array 300. The input processor may comprise a max finder module 310, a record code register 320, and a first level-changing unit 315. The max finder module 310 of the input processor 305 may receive the block of words and may search the block of words to discover a maximum-frequency word, i.e., a word having a maximum number of occurrences in the block. The discovered word may be stored as an exchange rule (i.e., a record code) in the record code register 320 and may also be passed to the first level-changing unit 315 that applies the exchange rule to the block of words. For example, the first level-changing unit 315 may receive the record code from the record code register 320 and may reassign instances of the record code in the block of words to level 0 and may reassign the word previously assigned to level 0 to the level vacated by the maximum-frequency word. The modified block of words then may be programmed into the CTMC array 300 normally, i.e., according to the native-code scheme.

The illustrated apparatus further comprises sense amplifiers 325, a second level-changing unit 330, and an output buffer 335 configured to output words stored in the CTMC array 300. The sense amplifiers 325 may receive, according to an address or range of addresses in address registers (not shown), a block, or a portion of a block, of words, which may be referred to as "transformed words," corresponding to the words programmed according to the predetermined definition and the above description. The second level-changing unit 330 may receive the transformed words from the sense amplifiers 325 and may receive the record code from the record code register 320. The second level-changing unit 330 may untransform (i.e., restore) the original block of input data (e.g. words) by applying the exchange rule, i.e., by (a) replacing instances of words in the transformed output data that match the record code with n0 and (b) replacing instances of n0 with the record code. The second level-changing unit 330 may pass the restored words to the output buffer 335, which may output the restored words.

Figures 7A, 7B, 7C:
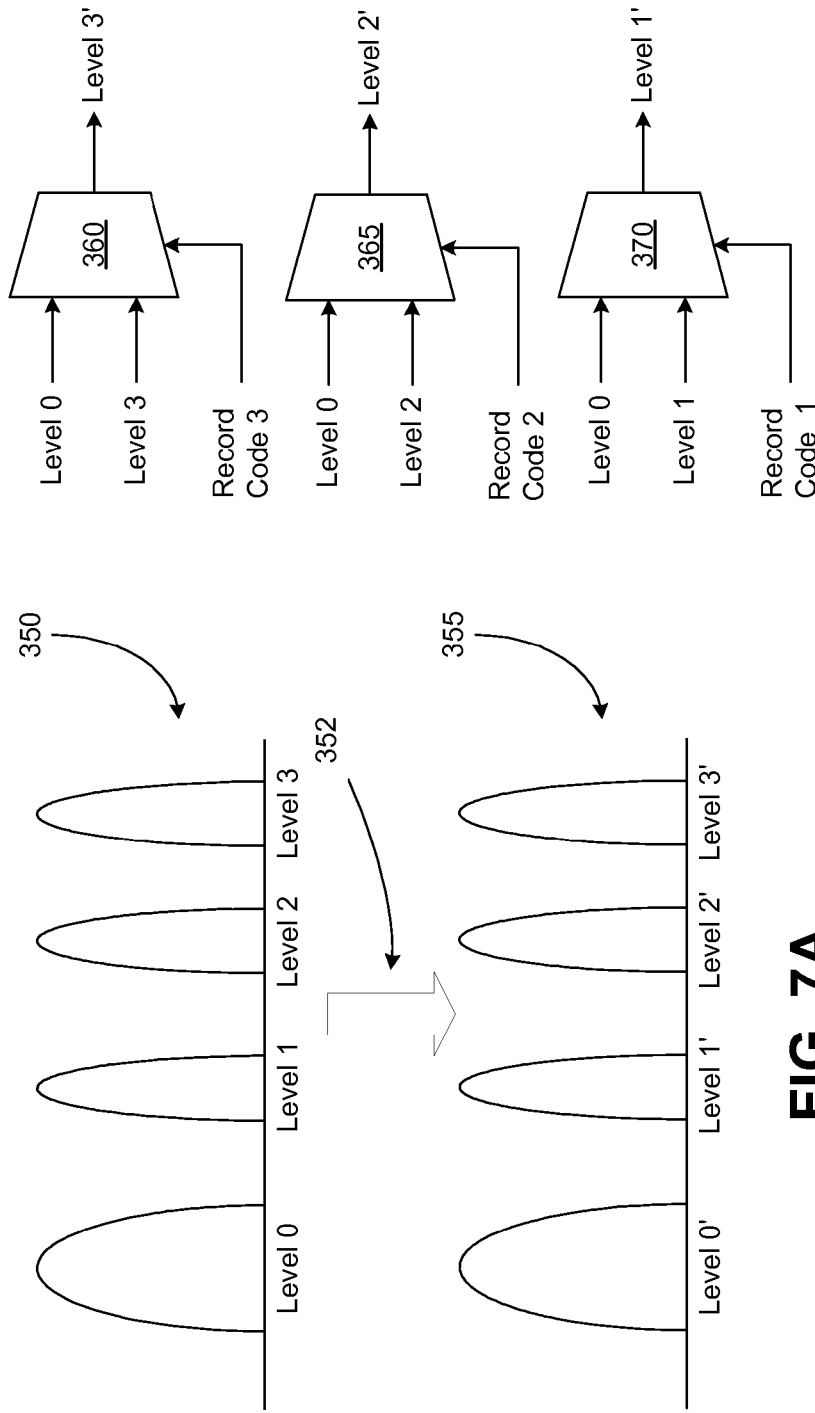
FIG. 7A is a pictorial diagram illustrating a method of the present invention.
FIG. 7B is a partial schematic diagram of an apparatus that may implement an exchange of programming levels according to the second method of the present invention.
FIG. 7C schematically diagrams an apparatus that may control reading from a multi-level charge-trapping memory according to the second method of the present invention.

FIG. 7A is a pictorial diagram that provides another view of an implementation of an embodiment of the present invention. According to this view, programming levels 0, 1, 2, or 3 in a multi-level (e.g., a 4-level) charge-trapping memory are transformed by a one-to-one mapping 352 into respective programming levels 0', 1', 2', or 3' according to either the first method or the second method of an embodiment of the present invention. Returning to the example described in Table 4, level 0 is mapped by the mapping 352 into level 1'; level 1 is mapped by the mapping 352 into level 3; level 2 is mapped into level 2; and level 3 maps into level 0'. By changing the mapping 352, the second method of an embodiment of the present invention may be implemented whereby level 3 is mapped into level 0', and level 0 is mapped into level 3'. Levels 1 and 2 are mapped into respective levels 1' and 2'.

FIG. 7B is a partial schematic diagram of an apparatus that may implement aspects of the second method of the present invention. The illustrated apparatus comprises respective first, second, and third multiplexers, 360, 365, and 370. Each multiplexer may be configured to receive two input signals, a first input signal corresponding to level 0, and a second input signal corresponding to either level 3 (360), level 2 (365) or level 1 (370). Each multiplexer, further, may be controlled by a record code input, which may be one or zero, according to whether the level 3, level 2, or level 1 programming level is to be exchanged with level 0. For example, first multiplexer 360 receives level 0 and level 3 as inputs, one of which is selected as level 3', the output of first multiplexer 360 according to a state of a control input Record Code 3. When Record Code 3=0, level 3' may be level 3; when Record Code 3=1, level 3' may be level 0. Similarly, second multiplexer 365 receives level 0 and level 2 as inputs and may select an output level 2' to be level 0 or level 2 according to a state of a control input Record Code 2. When Record Code 2=0, level 2' may be level 2; when Record Code 2=1, level 2' may be level 0. Similarly, an output level 1' may be either level 0 or level 1 according to a value of Record Code 1.

FIG. 7C is a partial schematic diagram of an apparatus that may facilitate reading from a multi-level (e.g., 4-level) multi-level charge-trapping memory according to the second method of an embodiment of the present invention. The illustrated apparatus comprises a demultiplexer 375 having an input corresponding to level 0' and one of four outputs corresponding to levels 0, 1, 2, and 3, which levels correspond to original programming levels in use before programming levels were exchanged using, for example, the multiplexers 360, 365, and 370 of FIG. 7B. The input level 0' signal may be mapped into the original programming level according to a value of a 4-bit Record Code [3:1]. Allowed values of the Record Code [3:1] may be 000, 001, 010, or 001 in order to select an original programming level that was mapped into level 0'. A Record Code [3:1] value of zero (0) indicates that no exchange of programming levels occurred during programming. Consequently, no exchange is required upon reading.

Considering a programming example, with reference to FIGS. 7B and 7C, suppose level 1 corresponds to the data word having maximum frequency of occurrence in a collection of input data words. Then, according to the second method of the present invention, input words corresponding to level 0 would be programmed as level 1 words, input words corresponding to level 1 would be programmed as level 0 words (i.e., not programmed at all), level 2 input words would be programmed as level 2 words, and level 3 input words would be programmed as level 3. In the language of FIGS. 7B and 7C, Record Code 3=0, Record Code 2=0, and Record Code 1=1 meaning that level 3'=level 3, level 2'=level 2, level 1'=level 0 (i.e., not programmed). It is to be understood that level 0'=level 2.

Upon reading data programmed according to the immediately preceding example, referring to FIG. 7C, Record Code [3:1]=001, which causes the output of demultiplexer 375 to be level 1. Accordingly, level 0 data read from the charge-trapping memory is to be replaced with data corresponding to level 1 and level 1 data read from the charge-trapping memory is to be replaced with data corresponding to level 0.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A method, comprising:
providing a multi-level charge-trapping memory cell array, wherein each different word is matched to a different programming voltage level for programming in the array and wherein words having the same value are programmed in the array at the same programming voltage level;
receiving a block of words to be programmed;
counting a number of occurrences of each different word in the block to determine a frequency number for each different word; and
revising the matching, whereby a programming voltage level of at least one of the words is changed.

2. The method as set forth in claim 1, wherein:
greater programming voltage levels require commensurately greater programming times; and
the revising does not increase a time required to program the block.

3. The method as set forth in claim 2, wherein the revising reduces the time required to program the block.

4. The method as set forth in claim 1, wherein the revising comprises:
creating a first list comprising the programming voltage levels arranged in order of increasing voltage;
creating a second list comprising the words in the block arranged in order of decreasing frequency number, whereby words in the second list are in one-to-one correspondence with the programming voltage levels in the first list; and
associating each word in the second list with the corresponding programming voltage level in the first list, the correspondence defining an exchange rule.

5. The method as set forth in claim 4, further comprising:
programming the block of words according to the revised matching; and
writing the exchange rule.

6. The method as set forth in claim 5, further comprising:
reading the exchange rule;
retrieving at least a portion of the programmed block of words from the array; and
restoring the portion according to the exchange rule.

7. A method, comprising:
providing a multi-level charge-trapping memory cell array, wherein different words are matched to a different programming voltage levels for programming into the array and words having the same value are programmed into the array at the same programming voltage level;
receiving a block of words to be programmed;
counting a number of occurrences of different words in the block; and
revising the matching, whereby at least one word is matched to a lower programming voltage level.

8. The method as set forth in claim 7, wherein:
the counting comprises determining a high-frequency word; and
the revising comprises matching the high-frequency word to a lower programming voltage level.

9. The method as set forth in claim 7, wherein:
a lowest-level word is matched to a lower programming voltage level before the revising;
the high-frequency word is matched to a first programming voltage level before the revising;
the revising matches the lowest-level word to the first programming voltage level; and
the method further comprises programming the block of words according to the revised matching.

10. The method as set forth in claim 7, further comprising:
obtaining an exchange rule;
retrieving at least a portion of the programmed block of words from the array; and
restoring the portion according to the exchange rule.

11. The method as set forth in claim 7, wherein the revising comprises matching a highest-frequency word to a lowest programming voltage level of the array.

12. An apparatus, comprising:
a charge-trapping memory cell array configured to store multi-level data according to a predetermined definition, which matches different words with different programming voltage levels; and
a processor coupled to receive a block of words to be programmed, the processor being configured to determine a high-frequency word in the block of words and to change the definition of the high-frequency word to a lower programming voltage level.

13. The apparatus as set forth in claim 12, wherein:
each different word is matched to a different programming voltage level for programming in the array;
words having the same value are programmed in the array at the same programming voltage level; and
the processor is configured to determine a maximum-frequency word in the block of words and to change the definition of the maximum-frequency word to a lower programming voltage level.

14. The apparatus as set forth in claim 13, wherein the processor is configured to change the definition of the maximum-frequency word to a lowest programming voltage level.

15. The apparatus as set forth in claim 12, wherein:
each different word is matched to a different programming voltage level for programming in the array;
words having the same value are programmed in the array at the same programming voltage level; and
the processor is configured to change the definition of the high-frequency word to a lowest programming voltage level.

16. The apparatus as set forth in claim 12, the processor being configured to write the high-frequency word into storage as a record code.

17. The apparatus as set forth in claim 12, the processor comprising a max finder module configured to search the block of words to discover a maximum-frequency word and to write the maximum-frequency word into storage as a record code, and further comprising a first level-changing unit configured to receive the block of words and the record code and to revise the matching whereby the maximum-frequency word is matched to a lowest programming voltage level.

18. The apparatus as set forth in claim 12, wherein the charge-trapping memory cell array is configured to store four-level data.

19. The apparatus as set forth in claim 12, further comprising a record code register configured to store the record code.

20. The apparatus as set forth in claim 12, further comprising:
a plurality of sense amplifiers configured to receive a block of words from the multi-level charge-trapping memory cell array according to the predetermined definition; and
a second level-changing unit configured to receive the block of words from the plurality of sense amplifiers, receive the record code, and restore the block of words according to the record code.

* * * * *